(12) United States Patent
Guo (10) Patent No.: US 11,531,265 B2
(45) Date of Patent: Dec. 20, 2022

(54) IMPRINT TEMPLATE AND IMPRINT METHOD

(71) Applicant: BOE TECHNOLOGY GROUP CO., LTD., Beijing (CN)

(72) Inventor: Kang Guo, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 388 days.

(21) Appl. No.: 16/507,462

(22) Filed: Jul. 10, 2019

(65) Prior Publication Data
US 2020/0159114 A1    May 21, 2020

(30) Foreign Application Priority Data
Nov. 16, 2018  (CN) .......................... 201811366420.6

(51) Int. Cl.
*G03F 7/00* (2006.01)
*B32B 37/14* (2006.01)

(52) U.S. Cl.
CPC ............ *G03F 7/0002* (2013.01); *B32B 37/14* (2013.01)

(58) Field of Classification Search
None
See application file for complete search history.

(56) References Cited

U.S. PATENT DOCUMENTS

| | | | |
|---|---|---|---|
| 2011/0171431 A1* | 7/2011 | Ogino | G03F 7/0002 428/172 |
| 2011/0193263 A1 | 8/2011 | Lee et al. | |
| 2017/0179477 A1* | 6/2017 | Walters | H01M 4/5815 |
| 2018/0056577 A1 | 3/2018 | Lee et al. | |
| 2018/0143530 A1* | 5/2018 | Li | H01L 21/306 |

FOREIGN PATENT DOCUMENTS

| | | |
|---|---|---|
| CN | 102854741 A | 1/2013 |
| CN | 102955357 A | 3/2013 |
| CN | 103064137 A | 4/2013 |
| CN | 103576449 A | 2/2014 |
| CN | 107783370 A | 3/2018 |
| CN | 108511740 A | 9/2018 |
| DE | 19935558 A1 | 3/2001 |
| JP | H11339312 A | 12/1999 |
| KR | 101717952 B1 | 3/2017 |

OTHER PUBLICATIONS

First Office Action, including Search Report, for Chinese Patent Application No. 201811366420.6, dated Feb. 9, 2021, 11 pages.

* cited by examiner

*Primary Examiner* — Christopher T Schatz
(74) *Attorney, Agent, or Firm* — Westman, Champlin & Koehler, P.A.

(57) ABSTRACT

An imprint template and an imprint method are provided. The imprint template includes a base substrate, an imprinting pattern layer and a deformable layer; wherein the deformable layer is disposed on a surface of the imprinting pattern layer facing away from the base substrate, and a shape of a surface of the deformable layer facing away from the base substrate is identical to an equidistant expanded shape of a shape of a surface of the imprinting pattern layer facing away from the base substrate; the deformable layer is configured to have a variable thickness under an external stimulation.

9 Claims, 6 Drawing Sheets

IMPRINT TEMPLATE AND IMPRINT METHOD

CROSS-REFERENCE TO RELATED APPLICATION

This application claims the benefit of Chinese Patent Application No. 201811366420.6 filed on Nov. 16, 2018 in the China National Intellectual Property Administration, the whole disclosure of which is incorporated herein by reference.

TECHNICAL FIELD

The present disclosure relates to the field of nanoimprint technology, and more particularly to an imprint template and an imprint method.

BACKGROUND

Detachment is one of core processes of nanoimprint technology. It is a most basic requirement of nanoimprint technology to smoothly separate a cured imprint adhesive structure from an imprint template and to ensure that the imprint adhesive structure is not damaged. In an actual imprint process, due to problems such as complexity of the imprint template, the imprint adhesive tends to be peeled off, the imprinted pattern is distorted, and fidelity of the nanoimprint process is poor during the detachment.

SUMMARY

According to an aspect of the present disclosure, there is provided an imprint template, comprising: a base substrate, an imprinting pattern layer and a deformable layer;
  wherein the deformable layer is disposed on a surface of the imprinting pattern layer facing away from the base substrate, and a shape of a surface of the deformable layer facing away from the base substrate is identical to an equidistant expanded shape of a shape of a surface of the imprinting pattern layer facing away from the base substrate;
  the deformable layer is configured to have a variable thickness under external stimulation.

In some embodiments, the shape of the surface of the deformable layer facing away from the base substrate is identical to an equidistant expanded shape of the shape of the surface of the imprinting pattern layer facing away from the base substrate after the thickness of the deformable layer is changed.

In some embodiments, the deformable layer comprises: a first electrode layer, a second electrode layer, and an intermediate layer therebetween;
  the first electrode layer and the second electrode layer are configured to form an electric field when the first electrode layer and the second electrode layer are applied with different voltages, and the thickness of the deformable layer is increased under an action of the electric field.

In some embodiments, the intermediate layer comprises an electrolyte layer configured to respectively drive anions and cations contained in the electrolyte layer to respectively move towards the two electrode layers under the action of the electric field;
  the first electrode layer and/or the second electrode layer are/is an ion-embedded layer that may be embedded with ions so as to increase its own thickness.

In some embodiments, the ion-embedded layer comprises at least two layers of graphene.

In some embodiments, a gap is provided between two adjacent graphene single-layers in the at least two layers of grapheme, so as to be embedded with ions.

In some embodiments, the electrolyte layer comprises an ionic liquid.

In some embodiments, the intermediate layer comprises:
an electromorphic layer;
  the electromorphic layer is configured to undergo an expansion deformation in a thickness direction under the action of the electric field.

In some embodiments, the base substrate is integrally formed with the imprinting pattern layer.

In some embodiments, the imprint template further comprises an encapsulation layer;
  the encapsulation layer is located on a side of the deformable layer facing away from the base substrate, and a shape of a surface of the encapsulation layer facing away from the base substrate is identical to an equidistant expanded shape of the shape of the surface of the imprinting pattern layer facing away from the base substrate.

In some embodiments, an anti-adhesive agent is coated on the surface of the encapsulation layer facing away from the base substrate.

According to another aspect of the present disclosure, there is provided an imprint method based on the imprint template mentioned above, the imprint method comprising:
  applying an external stimulus to the deformable layer to increase the thickness of the deformable layer;
  imprinting an imprint adhesive on a substrate to be processed with the imprint template to form a pattern on the imprint adhesive;
  curing the imprint adhesive;
  removing the external stimulus, such that the thickness of the deformable layer is restored to an initial state, and the imprint template is preliminarily detached from the imprint adhesive;
  performing a detachment process.

In some embodiments, the imprint template is the imprint template according to claim 4, and the step of applying an external stimulus to the deformable layer comprises:
  applying different voltages to the first electrode layer and the second electrode layer, such that an electric field is formed between the first electrode layer and the second electrode layer, and anions and/or cations in the electrolyte layer are embedded in the ion-embedded layer, the thickness of the ion-embedded layer being increased;
  the step of removing the external stimulus comprises:
  stopping applying voltages to the first electrode layer and the second electrode layer, such that the electric field between the first electrode layer and the second electrode layer disappears, and ions embedded in the ion-embedded layer are returned to the electrolyte layer, the thickness of the ion-embedded layer being decreased.

In some embodiments, the imprint template is the imprint template mentioned above, and the step of applying an external stimulus to the deformable layer comprises:
  applying different voltages to the first electrode layer and the second electrode layer, such that an electric field is formed between the first electrode layer and the second electrode layer, and the electromorphic layer undergoes an expansion deformation in a thickness direction under the action of the electric field;

the step of removing the external stimulus comprises:
stopping applying voltages to the first electrode layer and the second electrode layer, such that the electric field between the first electrode layer and the second electrode layer disappears, and the thickness of the electromorphic layer is decreased.

In some embodiments, the imprint method further comprises: performing an anti-adhesive treatment on a surface of the encapsulation layer facing away from the base substrate.

DETAILED DESCRIPTION OF EMBODIMENTS

In order to enable those skilled in the art to better understand the technical solutions of the present disclosure, the imprint template and the imprint method provided by the present disclosure will be described in detail below with reference to the accompanying drawings.

The exemplary embodiments are described more fully hereinafter with reference to the accompanying drawings, but are not to be construed as limiting the present disclosure. Rather, these embodiments are provided so that this disclosure will be thorough and complete, and such that the scope of the present disclosure will be fully understood by those skilled in the art.

The terminology used herein is used for the purpose of describing particular embodiments instead of limiting the present disclosure. The singular forms "a", "the" and "said" used in the context will also be understood to be plural forms, unless the context clearly indicates otherwise. It should be understood that, the features, entities, steps, operations, elements and/or components are present, which is not excluded that one or more features, entities, steps, operations, elements, components, and/or groups thereof.

It will be understood that, although the terms first, second, etc. may be used herein to describe various elements, these elements should not be limited to those terms. These terms are only used to distinguish one element from another. Thus, a first element, a first component, or a first component discussed below could be termed a second component, a second component, or a second component without departing from the teachings of the disclosure.

The embodiments herein may be described with reference to a plan view and/or a cross-sectional view, by way of an ideal schematic of the present disclosure. Accordingly, the exemplary illustrations may be modified in accordance with manufacturing techniques and/or tolerances. Therefore, the embodiments are not limited to the embodiments shown in the drawings, but include modifications to the configurations formed based on the manufacturing process. Accordingly, the regions illustrated in the drawings have illustrative attributes, and the shapes of the regions shown in the drawings illustrate the specific shapes of the regions of the elements, but are not intended to be limiting.

All terms (including technical and scientific terms) used herein have same meaning as commonly understood by those skilled in the art, unless otherwise defined. It will also be understood that those terms such as those defined in commonly used dictionaries should be interpreted as having a meaning consistent with their meaning in the context of the related art and the background of the present disclosure, and will not be construed as having an idealized or excessively formal meaning, unless specifically defined herein otherwise.

Figure 1:
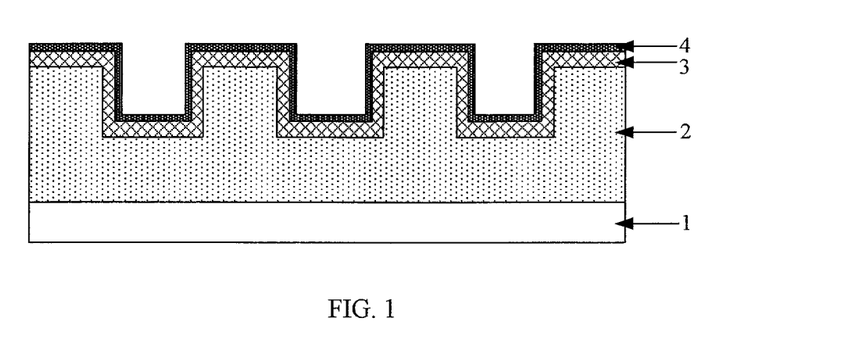
FIG. 1 is a schematic cross-sectional view of an imprint template according to an embodiment of the present disclosure.

FIG. 1 is a schematic cross-sectional view of an imprint template according to an embodiment of the present disclosure. As shown in FIG. 1, the imprint template includes a base substrate 1, an imprinting pattern layer 2, and a deformable layer 3.

The base substrate 1 may be a rigid substrate or a flexible substrate. The present disclosure does not limit properties of the base substrate 1 such as material and shape.

The imprinting pattern layer 2 is disposed on the base substrate 1, and a setting pattern is formed on a side of the imprinting pattern layer 2 facing away from the base substrate 1 (i.e., the imprinting surface), which setting pattern is used for patterning the imprint glue on the substrate to be processed during the imprint process. In the present disclosure, the material of the imprinting pattern layer 2 may be the same as the material of the base substrate 1, and thus the imprinting pattern layer 2 and the base substrate 1 may be integrally formed; of course, it is also possible to provide a base substrate 1 at first, and then form the imprinting pattern layer 2 on the base substrate 1. The base substrate 1 and the imprinting pattern layer 2 are two individual structures.

The deformable layer 3 is disposed on a surface of the imprinting pattern layer 2 on a side thereof facing away from the base substrate 1, and a shape of the surface of the deformable layer 3 facing away from the base substrate 1 is identical to a shape of the surface of the imprinting pattern layer 2 facing away from the base substrate 1; the deformable layer 3 is configured to vary in its thickness under an external stimulation.

It should be noted that, the above expression "a shape of the surface of the deformable layer facing away from the base substrate is identical to an equidistant expanded shape of a shape of the surface of the imprinting pattern layer on a side of the imprinting pattern layer facing away from the base substrate" specifically means that, corresponding to a region on the imprinting surface where a groove is formed, a similar groove is also formed on the surface of the deformable layer 3 on a side of the deformable layer facing away from the base substrate 1 in the region align with the region where the groove is formed; and corresponding to a region on the imprinting surface where a bulge is formed, a similar bulge is also formed on the surface of the deformable layer 3 on a side of the deformable layer facing away from the base substrate 1 in the region align with the region where the bulge is formed.

In the present disclosure, the deformable layer 3 is in direct contact with the imprinting surface of the imprinting pattern layer 2, and the deformable layer 3 has a thickness which is very thin (for example, 1 nm to 100 nm). Once the deformable layer 3 is disposed on the imprinting surface of the imprinting pattern layer 2, an overall shape of the deformable layer 3 is consistent with the overall shape of the setting pattern for imprinting. Such a deformable layer 3 does not significantly affect the shape of the setting pattern. Therefore, it does not affect the imprinting effect.

When the imprint process is performed by using the imprint template provided by the present disclosure, the problems that the imprint adhesive tends to be peeled off and the imprinted pattern is distorted will be avoided, and the fidelity of the nanoimprint process will be improved.

The specific processes of performing the imprint process using the imprint template provided by the present disclosure will be described in detail below with reference to the accompanying drawings.

Figure 2:
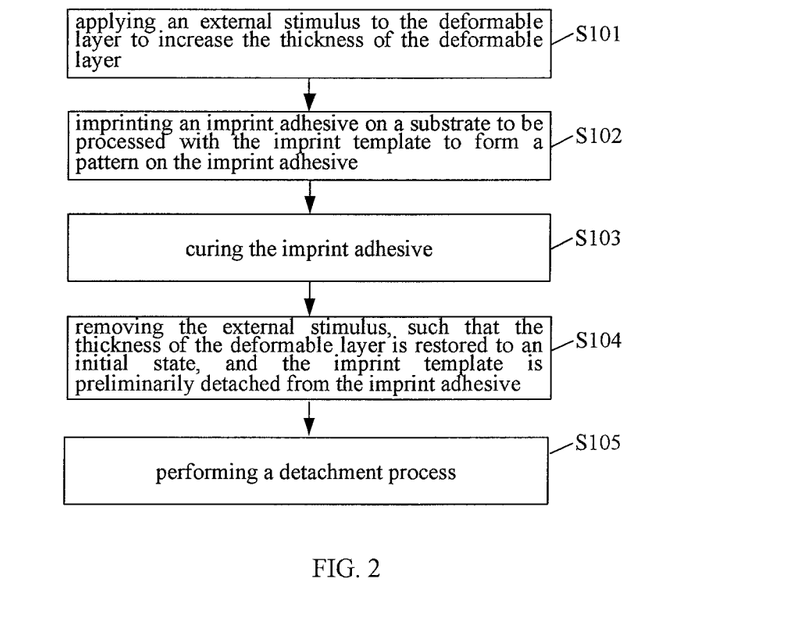
FIG. 2 is a flow chart of an imprint method according to an embodiment of the present disclosure.

FIG. 2 is a flow chart of an imprint method according to an embodiment of the present disclosure. As shown in FIG. 2, the imprint method is based on the imprint template described above, and the imprint method includes:

Step S101, applying an external stimulus to the deformable layer to increase the thickness of the deformable layer;

Step S102, imprinting an imprint adhesive on a substrate to be processed with the imprint template to form a pattern on the imprint adhesive.

It should be noted that, step S101 in the present disclosure may be started to be performed prior to step S102, or may be started to be performed in synchronization with step S102, or may be started to be performed after step S102 has been performed for a period of time.

Figure 3:
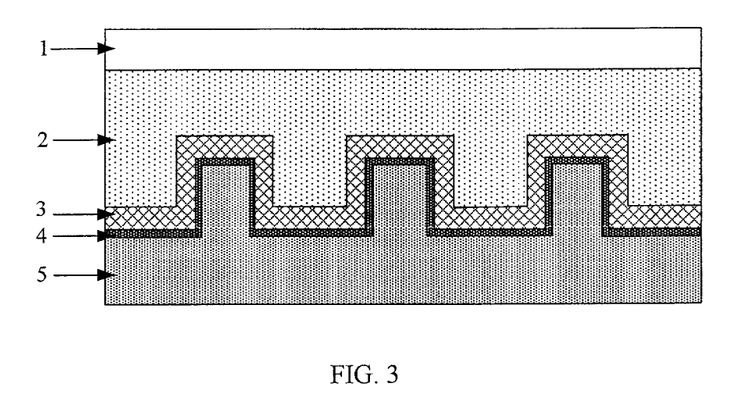
FIG. 3 is a schematic cross-sectional view showing a process of imprinting a substrate to be processed with an imprint template onto which an external stimulus is applied in the present disclosure.

FIG. 3 is a schematic cross-sectional view showing a process of imprinting a substrate to be processed with an imprint template to which an external stimulus is applied in the present disclosure. As shown in FIG. 3, after an external stimulus is applied to the deformable layer 3, the thickness of the deformable layer 3 is increased. When the imprint adhesive 5 is being imprinted, the deformable layer 3 is in contact with the imprint adhesive 5. However, since the thickness of the deformable layer 3 is relatively thin, it does not substantially affect the imprint effect, so the setting pattern may be imprinted onto the imprint adhesive 5 better.

Step S103, curing the imprint adhesive.

In step S103, the patterned imprint adhesive 5 may be cured by a curing process such as heat curing and light curing.

Figure 4:
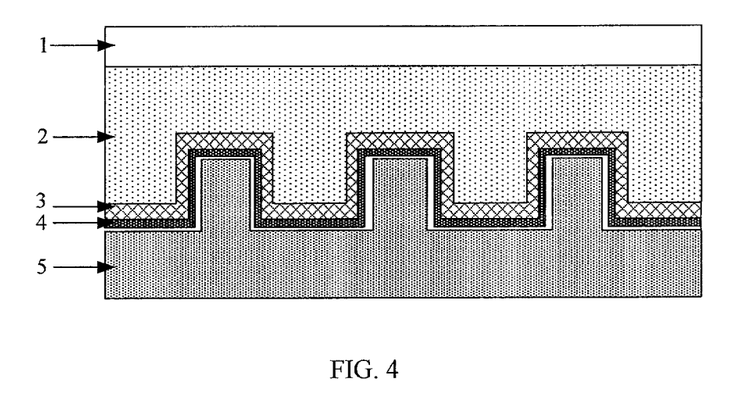
FIG. 4 is a schematic cross-sectional view of the imprint template and the substrate to be processed which are preliminarily separated from each other, with all external stimulus being removed in the present disclosure.

Step S104, removing the external stimulus, such that the thickness of the deformable layer is restored to an initial state thereof, and the imprint template is preliminarily detached from the imprint adhesive FIG. 4 is a schematic cross-sectional view of the imprint template and the substrate to be processed which are preliminarily separated from each other with all external stimulus being removed in the present disclosure. As shown in FIG. 4, the external stimulus is removed, and the thickness of the deformable layer 3 is gradually decreased until its initial state is restored, at that time the imprint template is preliminarily detached from the imprint adhesive 5. It should be noted that, in the process that the thickness of the deformable layer 3 is restored to the initial state, although shearing forces are generated between the imprint template and the imprint adhesive 5, due to the fact that the shearing forces are relatively balanced in various region, and an amplitude of the thickness variation of the deformable layer 3 is small, the pattern on the surface of the imprint adhesive 5 will not suffer from defects such as peeling-off, distortion.

Step S105, performing a detachment process.

Figure 5:
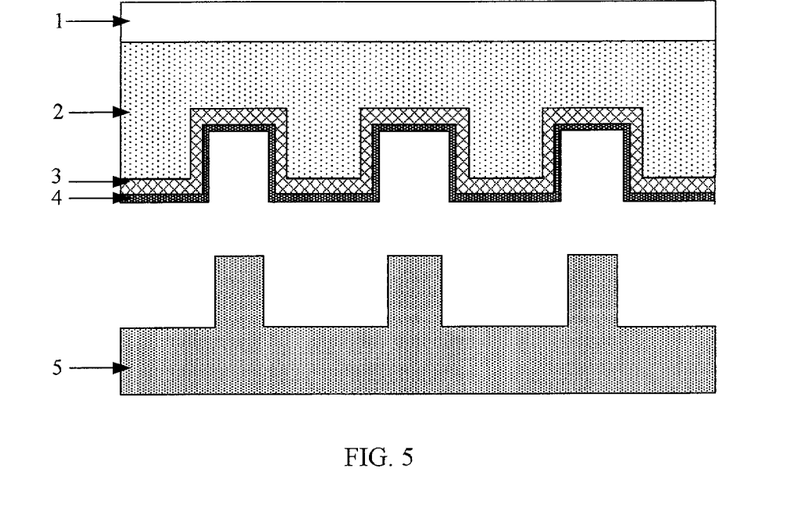
FIG. 5 is a schematic cross-sectional view of the imprint template being completely separated from the substrate to be processed in the present disclosure.

FIG. 5 is a schematic cross-sectional view of the imprint template being completely separated from the substrate to be processed in the present disclosure. As shown in FIG. 5, the detachment process of the related art is used for detachment treatment. Since the imprint template and the imprint adhesive 5 have been preliminarily separated from each other, a shearing force between the imprint template and the imprint adhesive 5 is relatively small during the detachment process, and then the pattern on the surface of the imprint adhesive 5 will not suffer from defects such as peeling-off, distortion.

It can be seen that the technical solution of the present disclosure can effectively avoid the problem that the imprint adhesive 5 tends to be peeled off and the imprinted pattern is distorted will be avoided, such that fidelity of the nanoimprint process will be improved.

In an alternative solution, a surface profile of the deformable layer 3 on a side of the deformable layer 3 facing away from the base substrate 1 coincides with an equidistant expanded profile of the surface profile of the imprinting pattern layer 2 on a side of the imprinting pattern layer 2 facing away from the base substrate 1. It should be noted that, in the present disclosure, the expression "an equidistant expanded profile of the surface profile of the imprinting pattern layer 2 on a side of the imprinting pattern layer 2 facing away from the base substrate 1" specifically means a profile obtained by equidistantly expanding the surface profile of the imprinting pattern layer 2 on a side of the imprinting pattern layer 2 facing away from the base substrate. The expanded profile will be different when the expanded distance is different. However, overall shape characteristics of the expanded profiles remain the same. In other words, the surface profile of the imprinting pattern layer 2 on a side of the imprinting pattern layer 2 facing away from the base substrate is in similar shape to its equidistant expanded profile. In the alternative solution, the profile obtained by equidistantly expanding the surface profile of the imprinting pattern layer 2 on a side of the imprinting pattern layer 2 facing away from the base substrate by a certain distance, may be completely overlapped with the surface profile of the deformable layer 3 on a side of the deformable layer 3 facing away from the base substrate 1. In such a condition, a distortion of the pattern imprinted with the imprint template may be avoided.

As an alternative solution, the imprint template further includes: an encapsulation layer 4, the encapsulation layer is located on a side of the deformable layer 3 facing away from the base substrate 1, and a shape of the surface of the encapsulation layer 4 on the side of the encapsulation layer 4 facing away from the base substrate 1 is identical to an equidistant expanded shape of the shape of the surface of the imprinting pattern layer 2 on a side of the imprinting pattern layer 2 facing away from the base substrate 1; the encapsulation layer 4 is configured to encapsulate the deformable layer 3, thereby protecting the deformable layer 3. The material of the encapsulation layer 4 may be at least one of silicon oxide and aluminum oxide. In a process of actually preparing the encapsulation layer 4, the encapsulation layer 4 may be prepared using an atomic layer deposition (ALD for short).

Further alternatively, the surface profile of the encapsulation layer 4 on a side of the encapsulation layer 4 facing away from the base substrate 1 coincides with an equidistant expanded profile of the surface profile of the imprinting pattern layer 2 on a side of the imprinting pattern layer 2 facing away from the base substrate 1. That is, the profile obtained by equidistantly expanding the surface profile of the imprinting pattern layer 2 on a side of the imprinting pattern layer 2 facing away from the base substrate 1 by a certain distance, may be completely overlapped with the surface profile of the encapsulation layer 4 on a side of the encapsulation layer 4 facing away from the base substrate 1. In such a condition, a distortion of the pattern imprinted with the imprint template may be avoided.

Further alternatively, an anti-adhesive treatment (for example, coating an anti-adhesive agent) may be performed on the surface of the encapsulation layer 4 on a side of the encapsulation layer 4 facing away from the base substrate 1, and a shear force between the encapsulation layer 4 and the imprint adhesive 5 may be effectively reduced during the detachment process.

Figure 6:
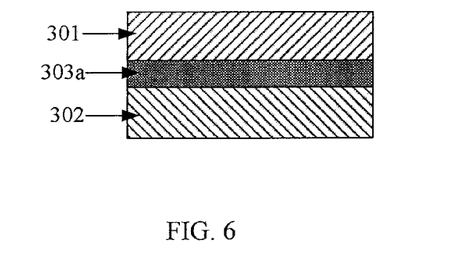
FIG. 6 is a schematic view showing a specific structure of a deformable layer in the present disclosure.

As an alternative solution, the deformable layer 3 comprises: a first electrode layer 301, a second electrode layer 302 and an intermediate layer therebetween; the first electrode layer 301 and the second electrode layer 302 are used to form an electric field when different voltages are applied to the first and second electrode layers, and the thickness of the deformable layer 3 is increased under an action of the electric field.

In such a condition, the external stimulus is specifically embodied as different voltages being applied to the first electrode layer 301 and the second electrode layer 302 respectively. magnitudes of the voltages applied to the first electrode layer 301 and the second electrode layer 302 may be designed, adjusted according to actual requirement.

FIG. 6 is a schematic view showing a specific structure of the deformable layer in the present disclosure. As shown in FIG. 6, the intermediate layer between the first electrode layer 301 and the second electrode layer 302 is an electrolyte layer 303a, and the electrolyte layer 303a contains anions and cations; at least one of the first electrode layer 301 and the second electrode layer 302 is an ion-embedded layer, and the ion-embedded layer may contain ions embedded therein to increase its own thickness.

In the following description, an exemplary description will be made by taking a case in which both the first electrode layer 301 and the second electrode layer 302 are ion-embedded layers as an example.

Figure 7:
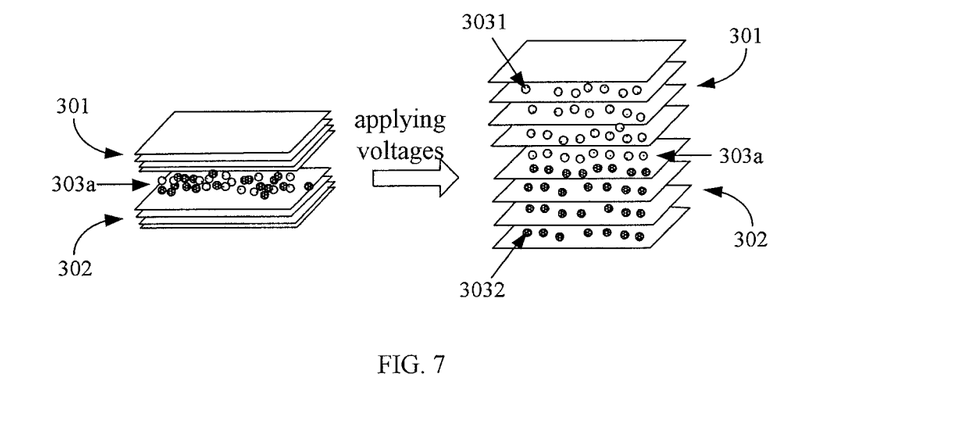
FIG. 7 is a schematic view showing a comparison of the deformable layer shown in FIG. 6 before and after different voltages are applied to the first electrode layer and the second electrode layer in the deformable layer.

FIG. 7 is a schematic view showing a comparison between statuses of both the first electrode layer 301 and the second electrode layer 302 in the deformable layer 3 shown in FIG. 6 before different voltages are applied to them and statuses of both the first electrode layer 301 and the second electrode layer 302 in the deformable layer 3 shown in FIG. 6 after different voltages are applied to them. As shown in FIG. 7, assuming that a first voltage applied to the first electrode layer 301 is greater than a second voltage applied to the second electrode layer 302. In such a condition, an electric field is formed between the first electrode layer 301 and the second electrode layer 302, and the electric field direction is directed from the first electrode layer 301 to the second electrode layer 302, and the cations 3032 and the anions 3031 in the electrolyte layer move respectively towards the second electrode layer 302 and the first electrode layer 301; a part of cations 3032 are embedded in the second electrode layer 302 (ion-embedded layer) such that the thickness of the second electrode layer 302 is increased; a part of the anions 3031 are embedded in the first electrode layer 301 (ion-embedded layer) such that the thickness of the first electrode layer 301 is increased; for the entire deformable layer 3, an overall thickness thereof is increased.

When the voltages on the first electrode layer 301 and the second electrode layer 302 are removed, the electric field between the first electrode layer 301 and the second electrode layer 302 disappears, and ions embedded in the first electrode layer 301 and the second electrode layer 302 are returned to the electrolyte layer, the thickness of the ion-embedded layer is decreased, and the overall thickness of the deformable layer 3 is restored to the initial state.

It should be appreciated by those skilled in the art that, the case in which the first electrode layer 301 and the second electrode layer 302 are both ion-embedded layers only serves as an example, which does not limit the technical solution of the present disclosure. In the present embodiment, it is only necessary to provide that at least one of the first electrode layer 301 and the second electrode layer 302 as an ion-embedded layer.

In the deformable layer shown in FIG. 6, as an alternative solution, the ion-embedded layer comprises: at least two layers of graphene, and a gap is provided between adjacent graphene single-layers. The gap may be embedded with ions and the distance between adjacent graphene single-layers is increased, so that the overall thickness is increased. After the electric field disappears, a pressing force will be generated between the adjacent graphene single-layers to press the ions embedded in the gap back to the electrolyte layer, thereby restoring the overall thickness to the initial state.

In the deformable layer as shown in FIG. 6, as an alternative solution, the electrolyte layer includes an ionic liquid containing a relatively large ion concentration to increase a reaction speed when the deformable layer is being deformed. The ionic liquid may be specifically N, N-diethyl-N-(2-methoxyethyl)-N-methylammonium bis (trifluoromethylsulphonyl)imide (DEME-TFSI for short).

Figure 8:
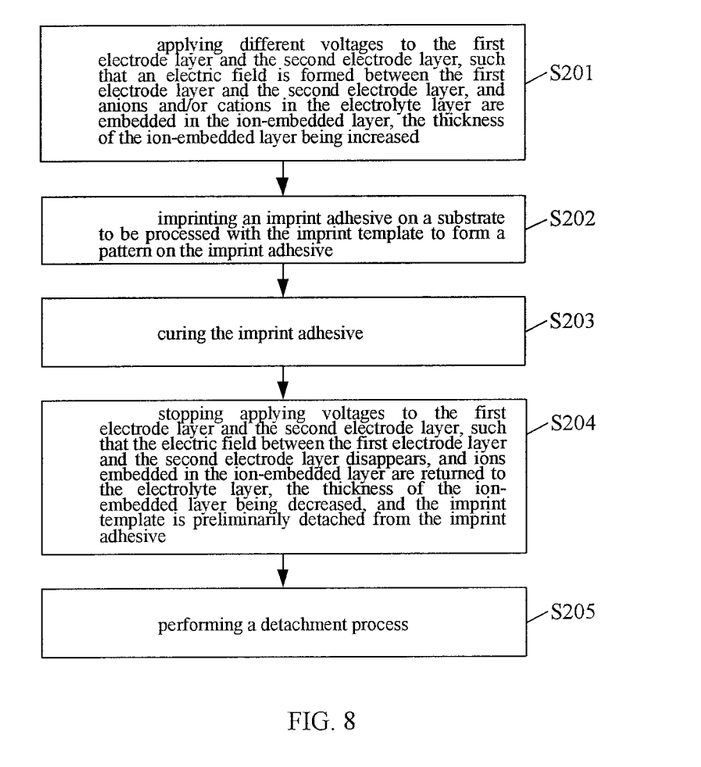
FIG. 8 is a flowchart of another imprint method according to an embodiment of the present disclosure.

FIG. 8 is a flow chart of another imprint method according to an embodiment of the present disclosure. As shown in FIG. 8, the imprint method shown in FIG. 8 is based on an imprint template including the deformable layer shown in FIG. 6. The imprint method includes:

Step S201, applying different voltages to the first electrode layer and the second electrode layer, such that an electric field is formed between the first electrode layer and the second electrode layer, and anions and/or cations in the electrolyte layer are embedded in the ion-embedded layer(s), the thickness of the ion-embedded layer(s) being increased.

Step S202, imprinting an imprint adhesive on a substrate to be processed with the imprint template to form a pattern on the imprint adhesive.

It should be noted that, step S201 in the present disclosure may be started to be performed before step S202, or may be started to be performed in synchronization with step S202, or may be started to be performed after step S202 has been performed for a period of time.

Step S203, curing the imprint adhesive.

Step S204, stopping applying voltages to the first electrode layer and the second electrode layer, such that the electric field between the first electrode layer and the second electrode layer disappears, and ions embedded in the ion-embedded layer are returned to the electrolyte layer, and then the thickness of the ion-embedded layer(s) may be decreased, and the imprint template is preliminarily detached from the imprint adhesive.

Step S205, performing a detachment process.

As for the detailed description of the foregoing steps S201 to S205, one can refer to the foregoing content, and details are not repeated herein again.

Figure 9:
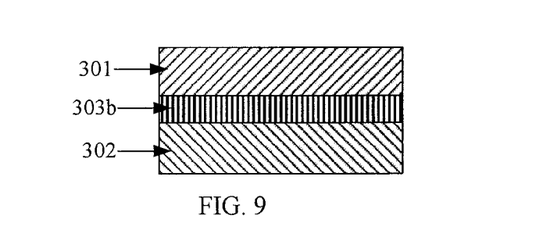
FIG. 9 is a schematic view showing another specific structure of the deformable layer in the present disclosure.

FIG. 9 is a schematic view showing another specific structure of the deformable layer in the present disclosure. As shown in FIG. 9, the intermediate layer between the first electrode layer 301 and the second electrode layer 302 is an electromorphic layer 303b, which is used to undergo an expansion deformation in the thickness direction under the action of an electric field.

Figure 10:
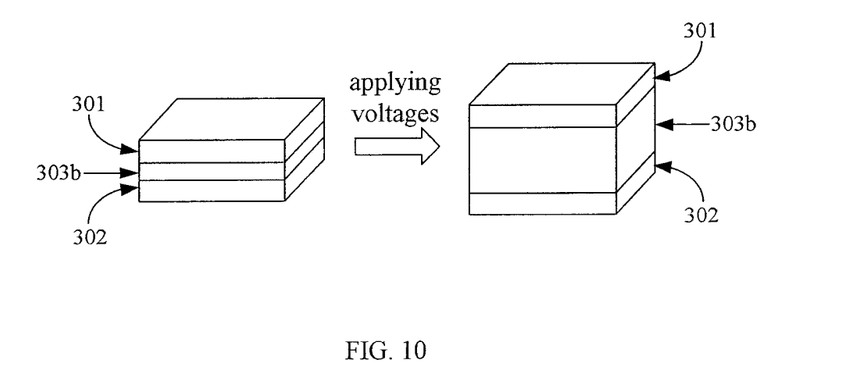
FIG. 10 is a schematic view showing a comparison of the deformable layer shown in FIG. 9 before and after different voltages are applied to the first electrode layer and the second electrode layer in the deformable layer.

FIG. 10 is a schematic view showing a comparison of statuses of both a first electrode layer and a second electrode layer in the deformable layer 3 shown in FIG. 9 before and after different voltages are applied to the first electrode layer 301 and the second electrode layer 302 in the deformable layer. As shown in FIG. 10, when different voltages are applied to the first electrode layer 301 and the second electrode layer 302, an electric field is formed between the first electrode layer 301 and the second electrode layer 302, and the electromorphic layer 303b is used to undergo an expansion deformation in the thickness direction under the action of an electric field, and the overall thickness of the deformable layer 3 is increased.

When the voltages applied on the first electrode layer 301 and the second electrode layer 302 are removed, the electric field between the first electrode layer 301 and the second electrode layer 302 disappears, and the electromorphic layer 303b is restored to the initial state under the action of its own stress. The overall thickness of the deformable layer 3 is decreased.

Figure 11:
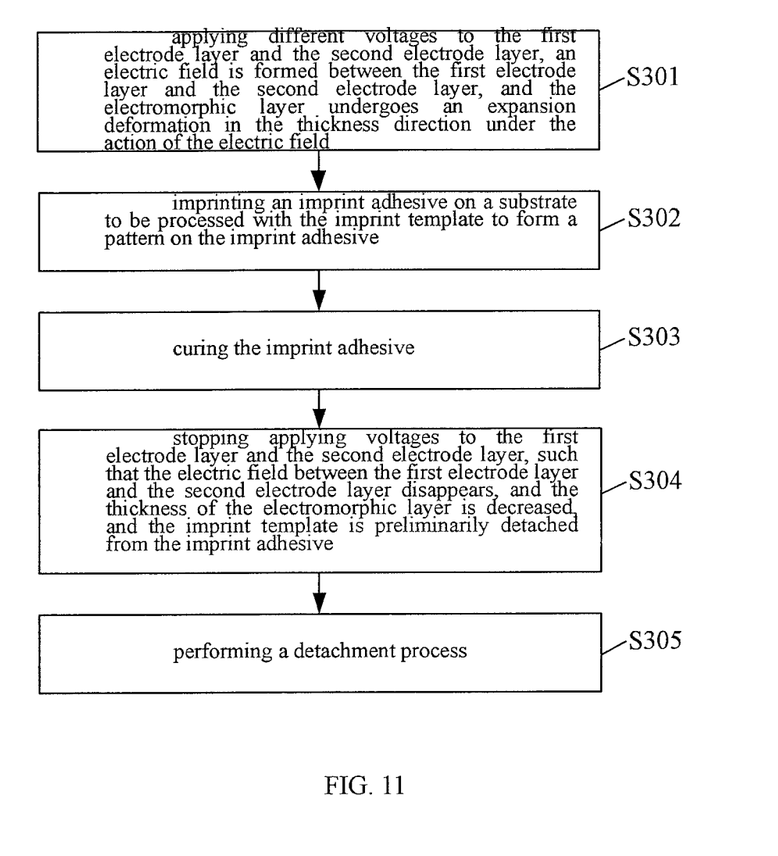
FIG. 11 is a flowchart of yet another imprint method according to an embodiment of the present disclosure.

FIG. 11 is a flowchart of yet another imprint method according to an embodiment of the present disclosure. As shown in FIG. 11, the imprint method shown in FIG. 11 is based on an imprint template including the deformable layer shown in FIG. 9. The imprint methods include:

Step S301, applying different voltages to the first electrode layer and the second electrode layer, an electric field is formed between the first electrode layer and the second electrode layer, and the electromorphic layer undergoes an expansion deformation in the thickness direction under the action of the electric field.

Step S302, imprinting an imprint adhesive on a substrate to be processed with the imprint template to form a pattern on the imprint adhesive.

It should be noted that, step S301 in the present disclosure may be started to be performed before step S302, or may be started to be performed in synchronization with step S302, or may be started to be performed after step S302 has been performed for a period of time.

Step S303, curing the imprint adhesive.

Step S304, stopping applying voltages to the first electrode layer and the second electrode layer, such that the electric field between the first electrode layer and the second electrode layer disappears, and the thickness of the electromorphic layer is decreased, and the imprint template is preliminarily detached from the imprint adhesive Step S305, performing a detachment process.

As for the detailed description of the foregoing steps S301 to S305, one can refer to the foregoing content, and details are not repeated herein again.

It should be noted that the deformable layer includes: a first electrode layer, a second electrode layer and an intermediate layer, and the case where the external stimulus is different voltages applied to the first electrode layer and the second electrode layer, is only an alternative solution in the present disclosure, which does not impose limitations on the technical solutions of the present disclosure. In the present disclosure, the deformable layer may also be other structures. For example, the deformable layer is prepared using a material having a relatively large thermal expansion coefficient. At this time, the external stimulus may be used to provide a high temperature environment to the imprint template, thereby increasing the thickness of the deformable layer. After the curing process is finished, a room temperature environment is restored, so that the thickness of the deformable layer is decreased and returned to the initial state, and a preliminary separation between the imprint template and the imprint adhesive is completed. As for other cases, it will not be listed one by one in the present disclosure. Those skilled in the art will know that any structures having a variable thickness under external stimulus may be used as the deformable layer in the present disclosure.

The technical solution of the present disclosure can effectively avoid the problems that the imprint adhesive tends to be peeled off and the imprinted pattern is distorted, thereby improving fidelity of the nanoimprint process.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

What is claimed is:

1. An imprint template, comprising: a base substrate, an imprinting pattern layer and a deformable layer;

wherein the deformable layer is disposed on a side of the imprinting pattern layer facing away from the base substrate, an orthographic projection of the deformable layer on the base substrate completely covers an orthographic projection of the imprinting pattern layer on the base substrate, a shape of a surface of the deformable layer facing away from the base substrate is identical to an equidistant expanded shape of a shape of a surface of the imprinting pattern layer facing away from the base substrate, and the shape of the surface of the deformable layer facing away from the base substrate is identical to the equidistant expanded shape of the shape of the surface of the imprinting pattern layer facing away from the base substrate after a thickness of the deformable layer is changed;

the deformable layer is configured to have a variable thickness under an external stimulation;

wherein the deformable layer comprises: a first electrode layer, a second electrode layer, and an intermediate layer therebetween;

the first electrode layer and the second electrode layer are configured to form an electric field when the first electrode layer and the second electrode layer are applied with different voltages, and the thickness of the deformable layer is increased under an action of the electric field; and are configured to restore the thickness of the deformable layer to an initial thickness when the different voltages applied on the first electrode layer and the second electrode layer are removed.

2. The imprint template according to claim 1, wherein the intermediate layer comprises an electrolyte layer configured to respectively drive anions and cations contained in the electrolyte layer to respectively move towards the first electrode layer and the second electrode layer under the action of the electric field;

the first electrode layer and/or the second electrode layer are/is an ion-embedded layer that may be embedded with ions so as to increase its own thickness.

3. The imprint template according to claim 2, wherein the ion-embedded layer comprises at least two layers of graphene.

4. The imprint template according to claim 3, wherein a gap is provided between two adjacent graphene single-layers in the at least two layers of graphene, so as to be embedded with the ions.

5. The imprint template according to claim 2, wherein the electrolyte layer comprises an ionic liquid.

6. The imprint template according to claim 1, wherein the intermediate layer comprises: an electromorphic layer; the electromorphic layer is configured to undergo an expansion deformation in a thickness direction under the action of the electric field.

7. The imprint template according to claim 1, wherein the base substrate is integrally formed with the imprinting pattern layer.

8. The imprint template according to claim 1, further comprising: an encapsulation layer;

the encapsulation layer is located on a side of the deformable layer facing away from the base substrate, and a shape of a surface of the encapsulation layer on facing away from the base substrate is identical to the equidistant expanded shape of the shape of the surface of the imprinting pattern layer facing away from the base substrate.

9. The imprint template according to claim 8, wherein an anti-adhesive agent is coated on the surface of the encapsulation layer facing away from the base substrate.

* * * * *